US008890003B2

(12) United States Patent
Gerken et al.

(10) Patent No.: US 8,890,003 B2
(45) Date of Patent: Nov. 18, 2014

(54) MULTIPLE-LAYERED ELECTROMAGNETIC SHIELDING

(71) Applicant: International Business Machines Corporation, Armonk, NY (US)

(72) Inventors: James D. Gerken, Zumbro Falls, MN (US); David B. Johnson, Rochester, MN (US); David G. Lund, Byron, MN (US); Timothy L. McMillan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 13/733,193

(22) Filed: Jan. 3, 2013

(65) Prior Publication Data

US 2014/0182923 A1    Jul. 3, 2014

(51) Int. Cl.
*H05K 9/00* (2006.01)
*H05K 13/00* (2006.01)

(52) U.S. Cl.
CPC . *H05K 9/00* (2013.01); *H05K 13/00* (2013.01)
USPC .......................................... 174/354; 174/355

(58) Field of Classification Search
USPC .................. 174/354, 355; 361/816, 818, 800; 277/920
See application file for complete search history.

(56) References Cited

U.S. PATENT DOCUMENTS

| | | | |
|---|---|---|---|
| 5,917,147 A | 6/1999 | Lewis | |
| 6,051,781 A | 4/2000 | Bianca et al. | |
| 6,359,768 B1 * | 3/2002 | Eversley et al. | 361/212 |
| 6,478,622 B1 * | 11/2002 | Hwang | 439/607.2 |
| 6,483,024 B1 * | 11/2002 | Smithson et al. | 174/354 |
| 6,879,495 B2 * | 4/2005 | Jiang | 361/818 |
| 7,317,618 B2 | 1/2008 | Robinson et al. | |
| 7,455,554 B2 * | 11/2008 | Long | 439/607.17 |
| 7,491,900 B1 * | 2/2009 | Peets et al. | 174/383 |
| 7,755,913 B2 * | 7/2010 | He | 361/816 |
| 7,910,839 B2 | 3/2011 | Lynam | |
| 2004/0052064 A1 | 3/2004 | Oliver et al. | |
| 2004/0120107 A1 * | 6/2004 | Davis et al. | 361/683 |
| 2007/0284142 A1 | 12/2007 | Jonker | |
| 2008/0043454 A1 | 2/2008 | Titus | |
| 2008/0060842 A1 | 3/2008 | Barringer et al. | |
| 2009/0086421 A1 | 4/2009 | Olesiewicz et al. | |
| 2010/0266246 A1 | 10/2010 | van Haaster | |

OTHER PUBLICATIONS

U.S. Appl. No. 09/459,772, entitled "Electromagnetic Interference (EMI) Shielding in a Computer System Housing Via Metal Contacts" filed Dec. 13, 1999.

* cited by examiner

*Primary Examiner* — Hung Ngo
(74) *Attorney, Agent, or Firm* — John W. Hayes

(57) ABSTRACT

An apparatus for electromagnetic compatibility (EMC) shielding, the apparatus comprising a first EMC shield with a plurality of substantially parallel interconnected finger elements spaced apart from one another. A second EMC shield with a plurality of substantially parallel interconnected finger elements spaced apart from one another. The first EMC shield coupled to the second EMC shield, wherein at least one finger element of the plurality of finger elements of the first EMC shield is situated between at least two finger elements of the plurality of finger elements of the second EMC shield and in parallel with the at least two finger elements such that a space is formed between the at least one finger element and at least one of the at least two finger elements.

16 Claims, 6 Drawing Sheets

MULTIPLE-LAYERED ELECTROMAGNETIC SHIELDING

FIELD OF THE INVENTION

This disclosure relates generally to electromagnetic compatibility shielding, and in particular, to decreasing the effects of electromagnetic interference on electronic components.

BACKGROUND

For purposes of this disclosure, the term electromagnetic interference (EMI) is understood to refer to electromagnetic emission and radiation that includes both electromagnetic interference and radio-frequency interference (RFI). The term electromagnetic compatibility (EMC) is understood to refer to the ability to combat EMI through the shielding of electronic components which may be affected by EMI.

Certain electronic parts, located primarily on circuits, radiate electromagnetic waves, which can cause noise (i.e., unwanted signals) to appear in other electronic components existing within a certain proximity of the radiating electronic parts. Accordingly, it is common to provide shielding and/or grounding for electronic components that use circuitry that emits electromagnetic radiation or for electronic components that are susceptible to electromagnetic radiation. Such shielding may be grounded to allow the electromagnetic radiation to be dissipated without disrupting the operation of the electronic components.

One method for providing this shielding has been through a stamped metal shield having individual "fingers," or elongated metal strips, typically made of a stainless steel. Such an EMC shield is also know as a "fingerstock" and is typically placed over an electronic component to reflect or contain EMI emissions. These fingers are formed around the electronic component to reduce undesirable EMI emission and/or effects of electromagnetic radiation. The spacing of each finger depends on the frequencies of the EMI waves. Typically, the higher the frequency that the EMC shield is designed to protect the electronic component from, the smaller the spacing between the fingers. Reducing the space between the fingers may also reduce the amount of unwanted emissions that may pass through the EMC shield from the components.

To reduce the spacing between the fingers, a stamping tool used to manufacture the EMC shield has to be made smaller in order to achieve the smaller gap. As a result, life expectancy of the stamping tool decreases as the gap between the fingers of the EMC shield is made smaller.

SUMMARY

One embodiment of the present invention provides an apparatus for electromagnetic compatibility (EMC) shielding comprising a first EMC shield with a plurality of substantially parallel interconnected finger elements spaced apart from one another. A second EMC shield with a plurality of substantially parallel interconnected finger elements spaced apart from one another. The first EMC shield coupled to the second EMC shield, wherein at least one finger element of the plurality of finger elements of the first EMC shield is situated between at least two finger elements of the plurality of finger elements of the second EMC shield and in parallel with the at least two finger elements such that a space is formed between the at least one finger element and at least one of the at least two finger elements.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

In general, an electromagnetic compliant (EMC) shield may include one or more sides, each comprising a plurality of finger elements. The finger elements are separated sections, or tabs, of a shielding material that interconnect at one end and are free at another. These sections are arranged to reduce undesirable EMI emission and/or the effects of electromagnetic radiation. The EMC shield may be positioned on a mounting surface such that the finger elements on each of the one or more sides surround internal components and/or circuitry. The EMC shield may also be in electrical contact with the mounting surface.

An exemplary embodiment of the present invention provides a multi-layered EMC shield, which is comprised of two or more EMC shields as described above, that interconnect. The orientation of the finger elements of the two or more EMC shields is such that, when the EMC shields are combined in a stacked formation, the finger elements point in the same direction and finger elements of one EMC shield are positioned in between finger elements of another EMC shield. In a preferred embodiment, the finger elements of the two or more EMC shields do not overlap.

Figure 1:
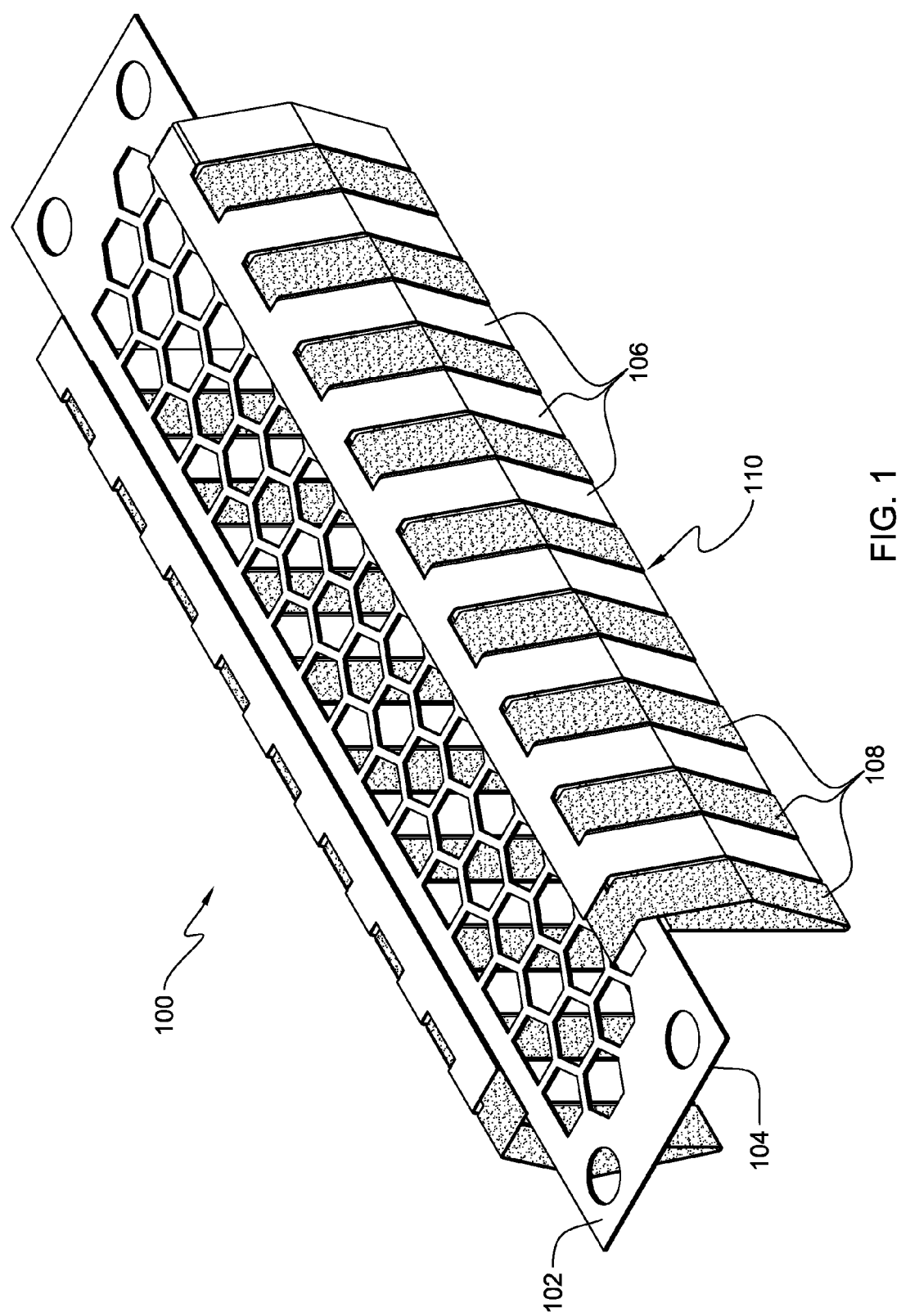
FIG. 1 depicts an isometric view of a multi-layered EMC shield in accordance with an embodiment of the present invention.

FIG. 1 depicts an isometric view of a multi-layered EMC shield 100 in accordance with an embodiment of the present invention.

In an exemplary embodiment, multi-layered EMC shield 100 is comprised of two EMC shields (i.e., EMC top shield 102 and EMC bottom shield 104). Multi-layered EMC shields are not limited to only two EMC shields but can be comprised of two or more EMC shields. Multi-layered EMC shield 100 is preferably composed of a metal capable of reflecting electromagnetic interference (EMI) waves. In the preferred embodiment, EMC top shield 102 and EMC bottom shield 104 are mounted together in a manner so that apertures located on the top of multi-layered EMC shield 100 are aligned. The aligned apertures provide cooling to components that multi-layered EMC shield 100 is situated over. The size of the apertures can be based on the alignment of EMC top shield 102 with EMC bottom shield 104 and/or the size and shape of stamped apertures on the surface of the EMC top shield 102 and EMC bottom shield 104.

Top finger elements 106 are part of EMC top shield 102 and bottom finger elements 108 are part of EMC bottom shield 104. When EMC top shield 102 is aligned with EMC bottom shield 104, top finger elements 106 and bottom finger elements 108 align in an alternating matter. For example, in this embodiment no two finger elements situated next to each other are similar. When top finger elements 106 are aligned with bottom finger elements 108, spacing 110 exists between every finger element. The size and positioning of the finger elements can be varied to adjust spacing 110 depending on the frequency of the electromagnetic interference (EMI) waves multi-layered EMC shield 100 is configured to protect against. A lower frequency EMI wave would require spacing 110 to be smaller. However, though a larger spacing 110 would protect only against higher frequency EMI waves, a larger spacing 110 would provide more cooling due to increased air flow.

Figure 2:
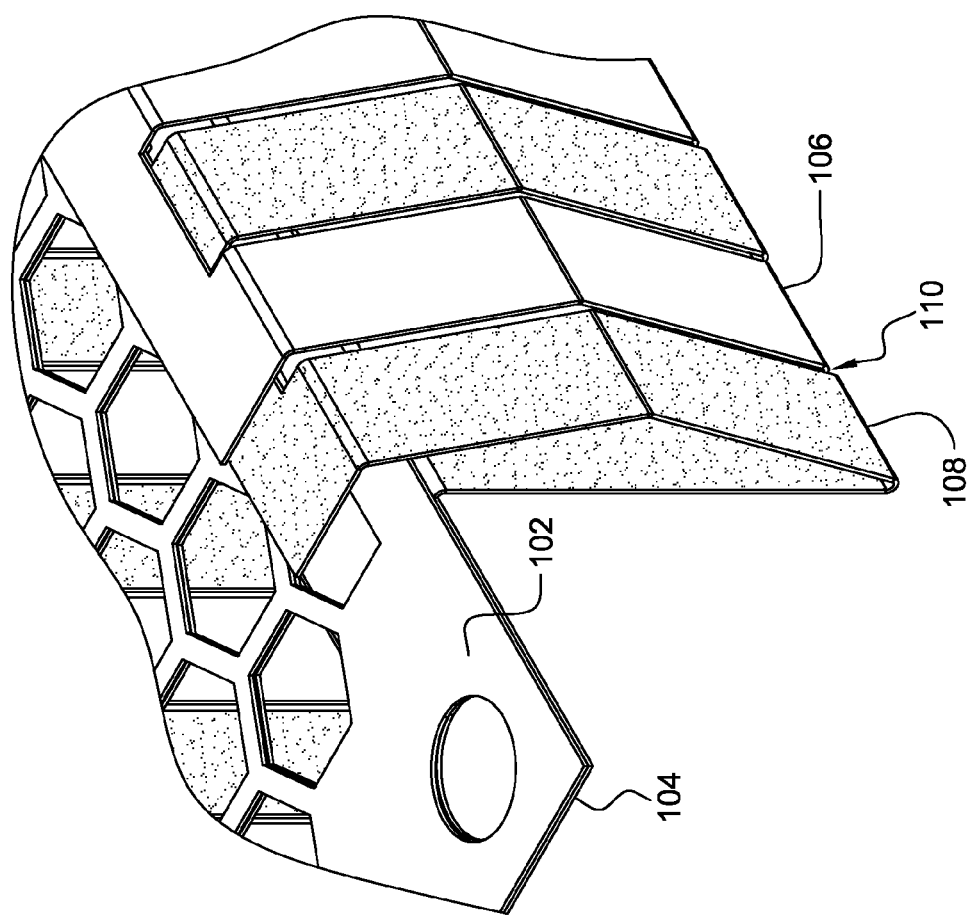
FIG. 2 depicts an enlarged view of the isometric perspective of the multi-layered EMC shield of FIG. 1.

FIG. 2 depicts an enlarged view of the isometric perspective of the multi-layered EMC shield 100. FIG. 2 illustrates how every finger element of either top finger elements 106 or bottom finger elements 108 are respectively connected. Connecting every finger element in top finger element 106 and every finger element in bottom finger element 108 provides rigidity for the multi-layered EMC shield 100 thus providing a uniform spacing 110 between each finger element of the alternating top finger elements 106 and bottom finger element 108.

Figure 3:
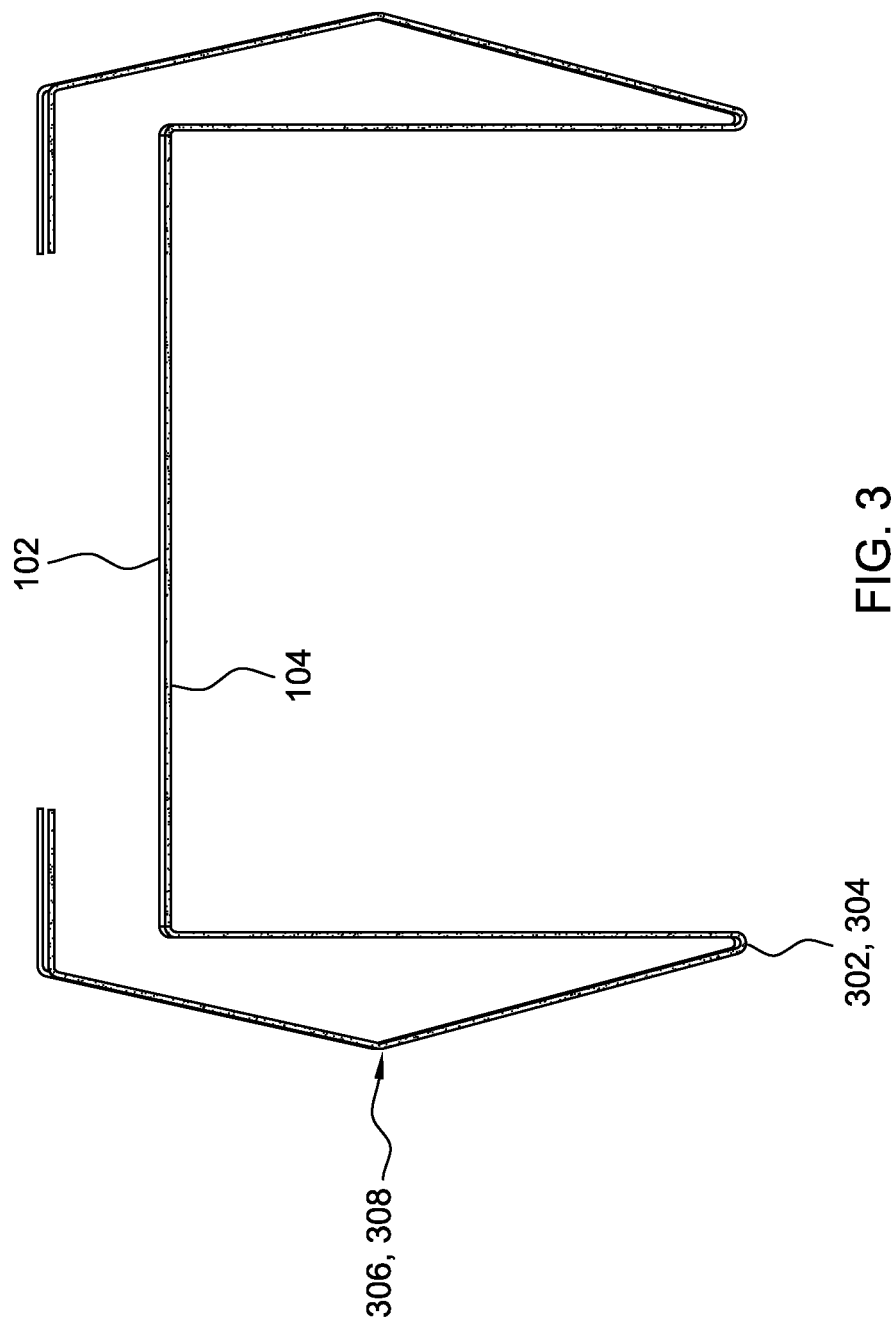
FIG. 3 depicts a forward perspective of the multi-layered EMC shield of FIG. 1.

FIG. 3 depicts a forward perspective of multi-layered EMC shield 100. As shown, EMC top shield 102 is coupled to EMC bottom shield 104 with top finger elements 106 aligning with bottom finger elements 108. Top finger elements 106 and bottom finger elements 108 curve generally downward from where EMC top shield 102 is coupled to EMC bottom shield 104 to define a u-shaped top hook portion 302 and bottom hook portion 304 respectively. U-shaped top hook portion 302 and bottom hook portion 304 lead into top spring arm portion 306 and bottom spring arm portion 308 respectively. Due to the shape of top spring arm portion 306 and bottom spring arm portion 308, both spring arms have the ability to be compressed in a spring like manner and to be attached to a designated mounting area. Upon attachment to the designated mounting area, top finger elements 106 and bottom finger elements 108 will be restrained or compressed such that a downward force is applied by top spring arm portion 306 and bottom spring arm portion 308 onto the mounting surface. This downward force will secure the multi-layered EMC shield 100 to the designated mounting surface.

In one embodiment, a gasket may exist between multi-layered EMC shield 100 and a designated mounting surface to further provide a seal where EMI waves can not pass through.

Figure 4:
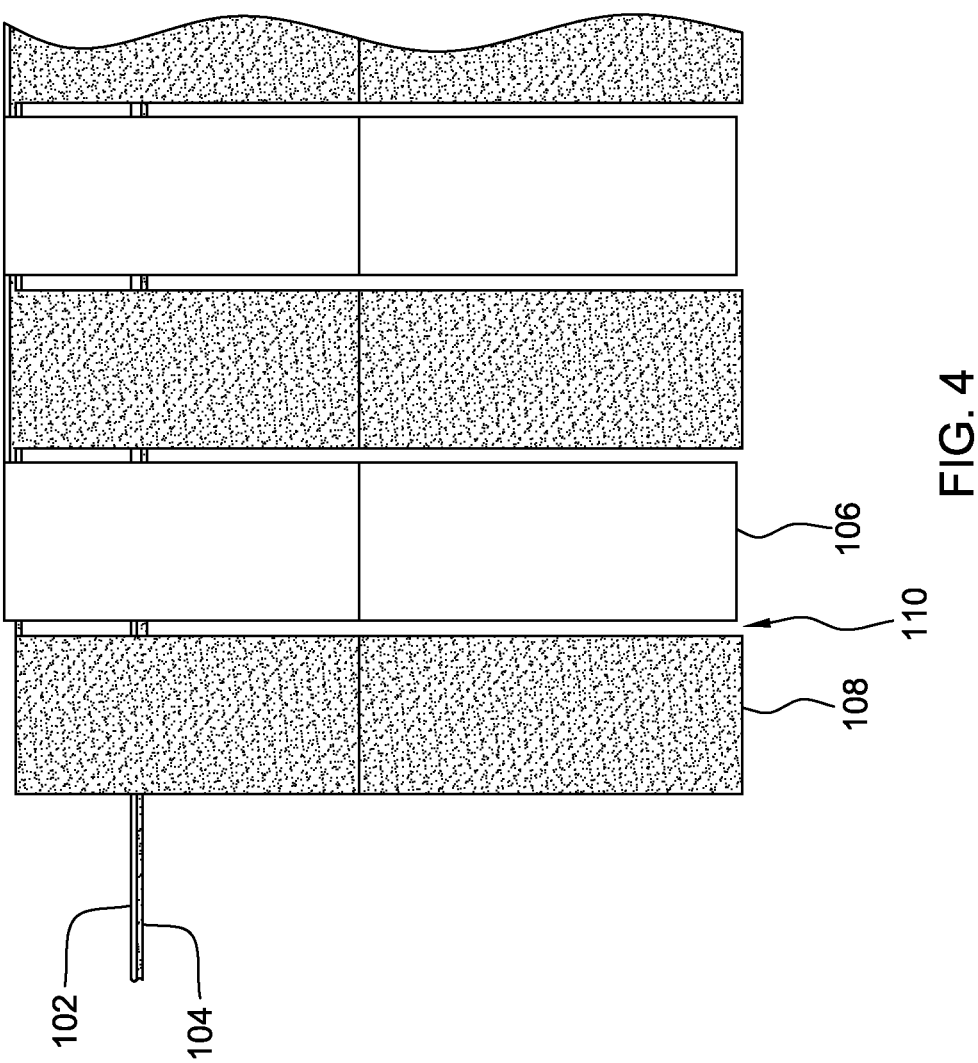
FIG. 4 depicts an enlarged view of a side perspective of the multi-layered EMC shield of FIG. 1.

FIG. 4 depicts an enlarged view of a side perspective of multi-layered EMC shield 100. As previously mentioned in the discussion of FIG. 1, top finger elements 106 and bottom finger elements 108 align in an alternating matter.

Figure 5:
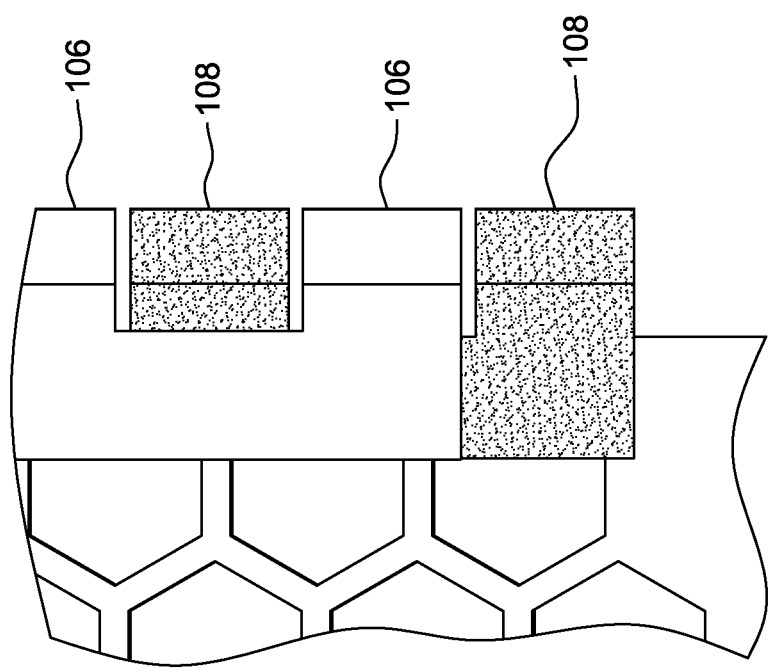
FIG. 5 depicts an enlarged view of a top perspective of the multi-layered EMC shield of FIG. 1.

FIG. 5 depicts an enlarged view of a top perspective of multi-layered EMC shield 100. As previously mentioned in the discussion of the FIG. 1, the alignment of the apertures when EMC top shield 102 is mounted on EMC bottom shield 104 is dependent on the necessary ventilation for cooling of the components located beneath the multi-layered EMC shield 100.

Figure 6:
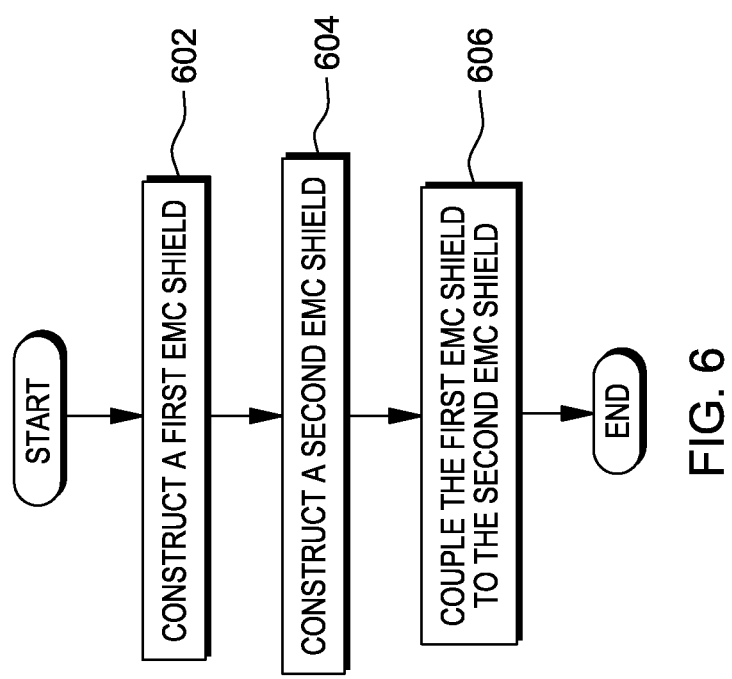
FIG. 6 is a flowchart depicting the manufacturing steps of the multi-layered EMC shield of FIG. 1.

FIG. 6 is a flowchart depicting the manufacturing steps of the multi-layered EMC shield 100. As previously mentioned in the discussion of FIG. 1, multi-layered EMC shield 100 is comprised of EMC top shield 102 and EMC bottom shield 104.

An exemplary process for creating multi-layered EMC shield 100 initializes by constructing EMC top shield 102 (step 602). EMC top shield 102 may be constructed using a mold template to stamp a piece of metal into the shape of EMC top shield 102. Stamping the piece of metal into the shape of EMC shield 102 will provide the clearly defined top finger elements 106. Upon the completion of constructing EMC top shield 102, the process calls for constructing EMC bottom shield 104 (step 604). Similar to the construction of EMC top shield 102, a mold template may be used to stamp a piece of metal into the shape of EMC bottom shield 104 with clearly defined bottom finger elements 108. Upon completion of construction of EMC top shield 102 and EMC bottom shield 104, the process calls for coupling EMC top shield 102 to EMC bottom shield 104 (step 606). The process couples EMC top shield 102 to EMC bottom shield 104 such that top finger elements 106 do not overlap bottom finger elements 108. Coupling EMC top shield 102 to EMC bottom shield 104 allows the tool used for stamping to be larger with a higher tolerance since spacing between each finger element of top finger elements 106 and the bottom finger elements 108, is greater. The small spacing between each finger element, which could previously be achieved using a smaller, lower tolerance stamping tool, can now be achieved by coupling EMC top shield 102 to EMC bottom shield 104.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a multi-layered EMC shield (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for electromagnetic compatibility (EMC) shielding, the apparatus comprising:
  a first EMC shield with a plurality of substantially parallel interconnected finger elements spaced apart from one another;
  a second EMC shield with a plurality of substantially parallel interconnected finger elements spaced apart from one another;
  the first EMC shield coupled to the second EMC shield, wherein at least one finger element of the plurality substantially parallel interconnected finger elements of the first EMC shield is situated between at least two finger elements of the plurality of substantially parallel interconnected finger elements of the second EMC shield and in parallel with the at least two finger elements such that a space is formed between the at least one finger element and at least one of the at least two finger elements;
  wherein the plurality of substantially parallel interconnected finger elements of the first EMC shield are interconnected at one end via a first plate running perpendicular to the plurality of substantially parallel finger elements of the first EMC shield; and wherein the plurality of substantially parallel interconnected finger elements of the second EMC shield are interconnected at one end via a second plate running perpendicular to the plurality of substantially parallel finger elements of the second EMC shield.

2. The apparatus of claim 1, further comprising:
a plurality of apertures on the first plate; and
a plurality of apertures on the second plate.

3. The apparatus of claim 1, wherein the first EMC shield coupled to the second EMC shield further comprises the first plate of the first EMC shield lying on the second plate of the second EMC shield.

4. The apparatus of claim 1, further comprising:
the first EMC shield aligned with the second EMC shield such that apertures on the first plate align with apertures on the second plate.

5. The apparatus of claim 1,
wherein the plurality of substantially parallel interconnected finger elements of the first EMC shield are interconnected to each other at a second end; and
wherein the plurality of substantially parallel interconnected finger elements of the second EMC shield are interconnected to each other at a second end.

6. The apparatus of claim 1, further comprising:
a second plurality of substantially parallel finger elements of the first EMC shield interconnected at a side of the first plate opposite that of the plurality of substantially parallel finger elements of the first EMC shield; and
a second plurality of substantially parallel finger elements of the second EMC shield interconnected at a side of the second plate opposite that of the plurality of substantially parallel finger elements of the second EMC shield.

7. The apparatus of claim 6,
wherein the second plurality of substantially parallel finger elements of the first EMC shield are interconnected to each other at a second end; and
wherein the second plurality of substantially parallel finger elements of the second EMC shield are interconnected to each other at a second end.

8. The apparatus of claim 1,
wherein a first space is formed between the at least one finger element and a first finger element of the at least two finger elements, and wherein a second space is formed between the at least one finger element and a second finger element of the at least two finger elements.

9. A method for manufacturing an electromagnetic compatibility (EMC) shield, the method comprising:
constructing a first EMC shield with a plurality of substantially parallel interconnected finger elements spaced apart from one another;
constructing a second EMC shield with a plurality of substantially parallel interconnected finger elements spaced apart from one another;
coupling the first EMC shield to the second EMC shield, wherein at least one finger element of the plurality of substantially parallel interconnected finger elements of the first EMC shield is situated between at least two finger elements of the plurality of substantially parallel interconnected finger elements of the second EMC shield and in parallel with the at least two finger elements such that a space is formed between the at least one finger element and at least one of the at least two finger elements;

wherein constructing the first EMC shield comprises interconnecting the plurality of substantially parallel interconnected finger elements of the first EMC shield at one end via a first plate running perpendicular to the plurality of substantially parallel finger elements of the first EMC shield; and wherein constructing the second EMC shield comprises interconnecting the plurality of substantially parallel interconnected finger elements of the second EMC shield at one end via a second plate running perpendicular to the plurality of substantially parallel finger elements of the second EMC shield.

10. The method of claim 9, further comprising:
cutting a plurality of apertures on the first plate; and
cutting a plurality of apertures on the second plate.

11. The method of claim 9, wherein coupling the first EMC shield to the second EMC shield comprises connecting the first plate of the first EMC shield to the second plate of the second EMC shield.

12. The method of claim 9, further comprising:
aligning the first EMC shield with the second EMC shield such that apertures on the first plate align with apertures on the second plate.

13. The method of claim 9,
wherein constructing the first EMC shield further comprises interconnecting the plurality of substantially parallel interconnected finger elements of the first EMC shield to each other at a second end; and
wherein constructing the second EMC shield further comprises interconnecting the plurality of substantially parallel interconnected finger elements of the second EMC shield to each other at a second end.

14. The method of claim 9,
wherein constructing the first EMC shield further comprises interconnecting a second plurality of substantially parallel finger elements of the first EMC shield at a side of the first plate opposite that of the plurality of substantially parallel finger elements of the first EMC shield; and
wherein constructing the second EMC shield further comprises interconnecting a second plurality of substantially parallel finger elements of the second EMC at a side of the second plate opposite that of the plurality of substantially parallel finger elements of the second EMC shield.

15. The method of claim 14,
wherein constructing the first EMC shield further comprises interconnecting the second plurality of substantially parallel finger elements of the first EMC shield to each other at a second end; and
wherein constructing the second EMC shield further comprises interconnecting the second plurality of substantially parallel finger elements of the second EMC shield to each other at a second end.

16. The method of claim 9, further comprising:
positioning the first and second EMC shields, wherein a first space is formed between the at least one finger element and a first finger element of the at least two finger elements, and wherein form a second space between the at least one finger element and a second finger element of the at least two finger elements.

* * * * *